United States Patent
Satoh et al.

(10) Patent No.: US 6,335,663 B1
(45) Date of Patent: Jan. 1, 2002

(54) MULTIPLEXER/BRANCHING FILTER

(75) Inventors: Yuki Satoh, Osaka; Naoki Yuda, Hirakata; Hidenori Katsumura, Kobe; Tsutomu Matsumura, Yao, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/423,977

(22) PCT Filed: Mar. 16, 1999

(86) PCT No.: PCT/JP99/01285

§ 371 Date: Feb. 28, 2000

§ 102(e) Date: Feb. 28, 2000

(87) PCT Pub. No.: WO99/48199

PCT Pub. Date: Sep. 23, 1999

(30) Foreign Application Priority Data

Mar. 17, 1998  (JP) .................................................. 10-066607

(51) Int. Cl.[7] ...................................................... H01P 5/12
(52) U.S. Cl. ............................. 333/126; 333/132; 333/185
(58) Field of Search .................................... 333/100, 121, 333/126, 204, 132, 185; 501/32, 45; 361/821, 303; 307/520

(56) References Cited

U.S. PATENT DOCUMENTS 5,880,649 A * 3/1999 Tai ................................. 333/132
6,140,891 A * 10/2000 Nakakubo ..................... 333/204

FOREIGN PATENT DOCUMENTS

| JP | 57-97715 A | * 12/1980 | ............... 333/168 |
|----|------------|-----------|------------------------|
| JP | 61-214625  | 9/1986    |                        |
| JP | 64-23123   | 2/1989    |                        |
| JP | 3-123201   | 5/1991    |                        |
| JP | 4-207806   | 7/1992    |                        |
| JP | 7-122905   | 5/1995    |                        |
| JP | 9-153842   | 6/1997    |                        |

OTHER PUBLICATIONS

Dipl.–Ing. Max Borchert, entitled "HF–Weichen, ein Überblick über Probleme und Schaltugen Teil II", Radio Mentor, vol. 26, No. 5, May 1960, pp. 378–382.

* cited by examiner

Primary Examiner—Justin P. Bettendorf
Assistant Examiner—Dean Takaoka
(74) Attorney, Agent, or Firm—Wenderoth, Lind & Ponack, L.L.P.

(57) ABSTRACT

The present invention relates to a multiplexer/demultiplexer for use in mobile communication devices and provides a small and low-loss multiplexer/demultiplexer. The present invention provides a multiplexer/demultiplexer including a first to a third ports each externally terminated with a pure resistance, in which the second port is made to be a common port by connecting between the first port and the ground a first resonant circuit which makes serial resonance at a frequency within a first frequency band or in its proximity, and further connecting an inductive element in series between the first port and the second port, and connecting between the third port and the ground a second resonant circuit which makes serial resonance at a frequency within a second frequency band which is different from the first frequency band or in its proximity, and further connecting a capacitive element in series between the third port and the second port.

14 Claims, 10 Drawing Sheets

MULTIPLEXER/BRANCHING FILTER

FIELD OF THE INVENTION

The present invention relates to a multiplexer/demultiplexer for use in mobile communication devices such as portable telephones.

BACKGROUND OF THE INVENTION

FIG. 14 represents a circuit construction of a conventional multiplexer/demultiplexer. In FIG. 14, the circuit is comprised of a low-pass filter 101, a high-pass filter 102, phase shifters 103, 104, input terminals 105, 106, and an output terminal 107. Here, low-pass filter 101 and high-pass filter 102 are configured as π-shaped 3-stage circuits.

In a filter of this configuration, as the filter functions closer to short-circuiting as the signal frequency goes away from the pass band, it will not function as a multiplexer/demultiplexer by simply connecting each filter as it is. Accordingly, by connecting phase shifters 103, 104 as shown in FIG. 14 on the side the filters are mutually connected, the phase of a signal outside of the pass band is shifted by about 180 degrees thereby to open the circuit. Phase shifters 103 and 104 are comprised of a transmission line such as a strip line.

However, this configuration suffered serious problems of difficulty in miniaturization because of the larger size of transmission lines composing phase shifters 103, 104 compared with other components and of a large loss due to longer line lengths.

SUMMARY OF THE INVENTION

The present invention is directed to providing an easy-to-miniaturize, low loss, high-performance multiplexer/demultiplexer.

In order to achieve the above purpose, the multiplexer/demultiplexer of the present invention includes first to third ports each externally terminated with a pure resistance, in which the third port is made to be a common port by connecting a first resonant circuit between the first port and the ground. The first resonant circuit makes serial resonance at a frequency within a first frequency band or in its proximity. An inductive element is connected in series between the first port and the third port, and a second resonant circuit is connected between the second port and the ground. The second resonant circuit makes serial resonance at a frequency within a second frequency band which is different from the first frequency band or in its proximity. A capacitive element is connected in series between the third port and the second port. This way, it is made possible to easily obtain a small and high-performance multiplexer/demultiplexer with a simple circuit with an exceptionally small number of elements without using a transmission line which tends to cause a loss.

BRIEF DESCRIPTION OF THE DRAWINGS

FIG. 12 is an equivalent circuit in which the parasitic capacitance in a high frequency region is taken into account in the fifth exemplary embodiment.

First Exemplary Embodiment

Figure 1:
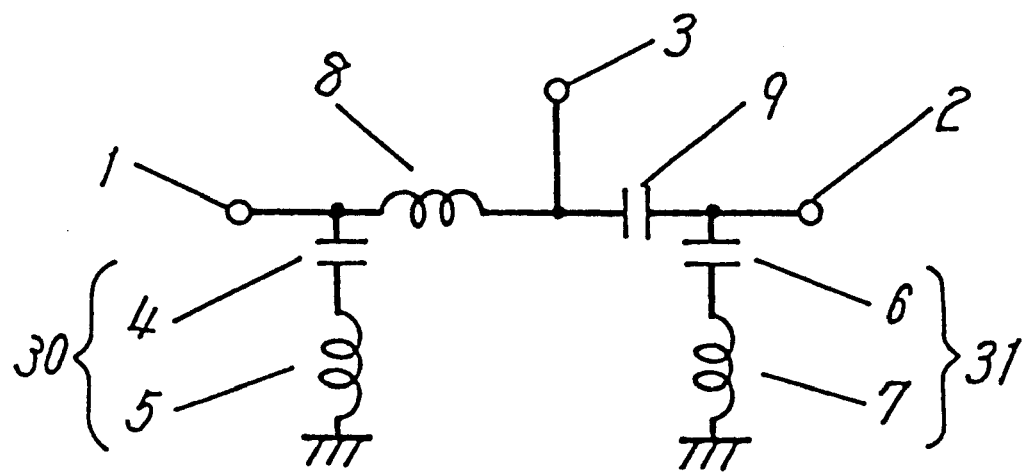
FIG. 1 is a circuit diagram of a multiplexer/demultiplexer in a first exemplary embodiment of the present invention.

Referring now to the drawings, a description of a first exemplary embodiment of the present invention will be given in the following.

FIG. 1 is a circuit diagram of a multiplexer/demultiplexer in the first exemplary embodiment of the present invention. In the drawing, numerals 1, 2, 3 are an input-output port (first port) for a low-frequency band, an input-output port (second port) for a high-frequency band, and a common input-output port (third port), respectively. Numerals 4, 6, 9 are capacitive elements, and numerals 5, 7, 8 are inductive elements.

Here, capacitive element 4 and inductive element 5, and capacitive element 6 and inductive element 7 are respectively connected in series forming respective serial resonant circuits 30, 31. Circuit constants are so chosen that serial resonant circuit 31 resonates in the pass band from second port 2 to third port 3, and serial resonant circuit 30 resonates in the pass band from first port 1 to third port 3.

Figure 2:
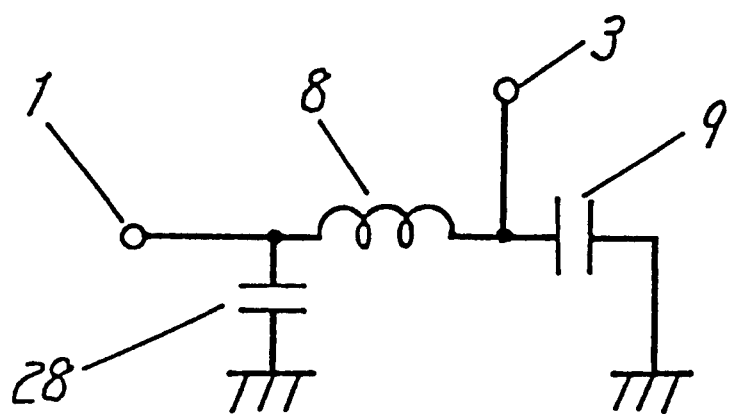
FIG. 2 is an equivalent circuit diagram showing a circuit operation of the multiplexer/demultiplexer.

When the circuit constants are chosen as above, at a frequency in the pass band from first port 1 which is in the low-frequency band to port 3, the circuit functions as an equivalent circuit represented by FIG. 2, namely, a π-type low-pass filter. Here, serial resonant circuit 30 functions equivalently to a capacitive element 28 as the frequency is lower than its resonant point.

Figure 3:
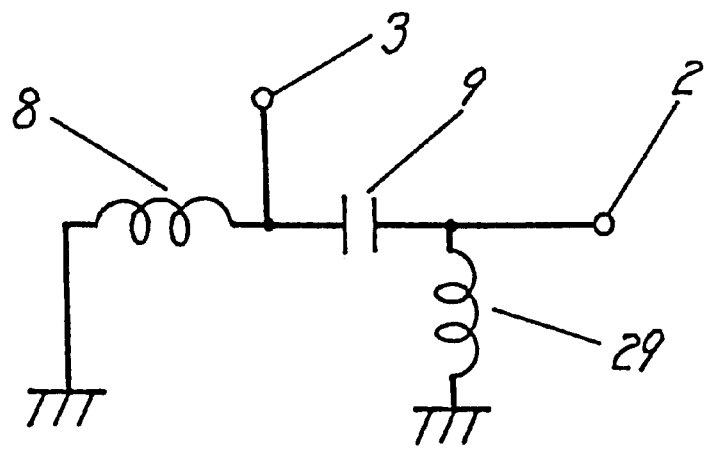
FIG. 3 is an equivalent circuit diagram showing a circuit operation of the multiplexer/demultiplexer.

On the other hand, at a frequency in the pass band from second port 2 which is in the high-frequency band to third port 3, the circuit functions as an equivalent circuit represented by FIG. 3, namely, a π-type high-pass filter. Here, serial resonant circuit 31 functions equivalently to an inductive element 29 as the frequency is higher than its resonant point.

Consequently, by employing the above circuit construction, it is possible to implement a multiplexer/demultiplexer with an exceptionally small number of elements thus realizing a small, high performance device.

Second Exemplary Embodiment

Referring to drawings, a description of a second exemplary embodiment of the present invention will be given in the following.

Figure 4:
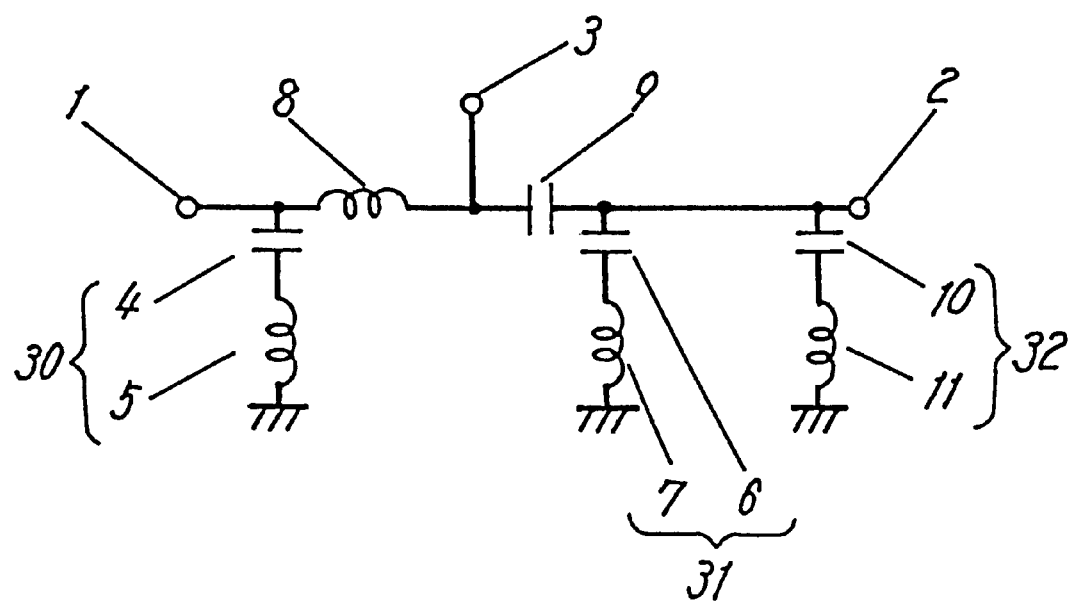
FIG. 4 is a circuit diagram of a multiplexer/demultiplexer in a second exemplary embodiment of the present invention.

FIG. 4 is a circuit diagram of a multiplexer/demultiplexer in a second exemplary embodiment of the present invention. The circuit of this embodiment is one in which a serial resonant circuit 32 comprising a capacitive element 10 and an inductive element 11 has been added between serial resonant circuit 31 and second port 2 of the first exemplary embodiment.

Here, the resonant point of serial resonant circuit 32 is set at a frequency about twice the pass band frequency from second port 2 to third port 3 thus enabling efficient elimination of harmonics from an amplifier and the like to be connected to second port 2 (providing an attenuating pole to eliminate high-frequency spurious components) and providing a multiplexer/demultiplexer with further enhanced performance.

Incidentally, by connecting serial resonant circuit 32 between serial resonant circuit 31 and second port 2 as illustrated in FIG. 4, it is possible to restrain deterioration of the pass characteristics from first port 1 to third port 3 due to the influence of serial resonant circuit 32.

Third Exemplary Embodiment

Referring to drawings, a description of a third exemplary embodiment of the present invention will be given in the following.

Figure 5:
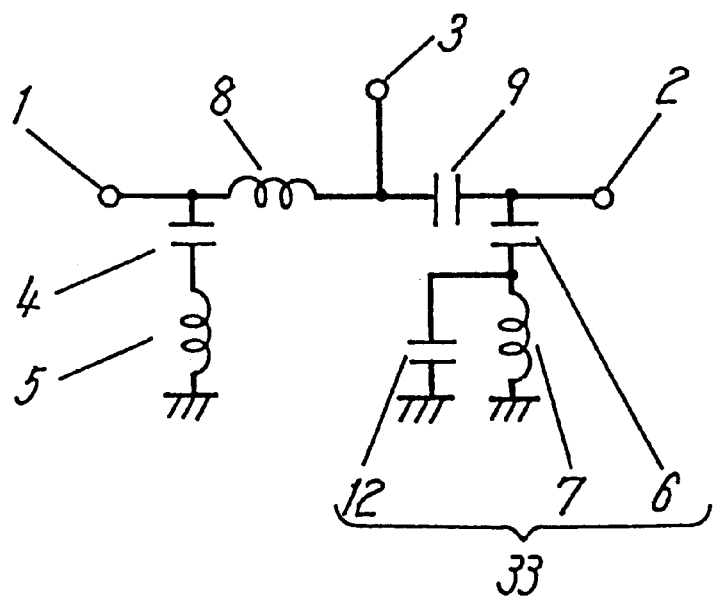
FIG. 5 is circuit diagram of a multiplexer/demultiplexer in a third exemplary embodiment of the present invention.

FIG. 5 is a circuit diagram of a multiplexer/demultiplexer in the third exemplary embodiment of the present invention. The circuit of this embodiment is one in which a capacitive element 12 has been connected in parallel with inductive element 7 of the first exemplary embodiment and furthermore the serial resonant point of a circuit 33 comprising capacitive elements 6, 12 and inductive element 7 has been set to be in the pass band from first port 1 to third port 3.

With this configuration, it is possible to realize a high performance multiplexer/demultiplexer function with an exceptionally small number of elements as well as to efficiently eliminate harmonics generated by an amplifier and the like to be connected to second port 2 because capacitive element 12 becomes a bypass passage for high-frequency signals.

Fourth Exemplary Embodiment

Referring now to drawings, a description of a fourth exemplary embodiment of the present invention will be given in the following.

Figure 6:
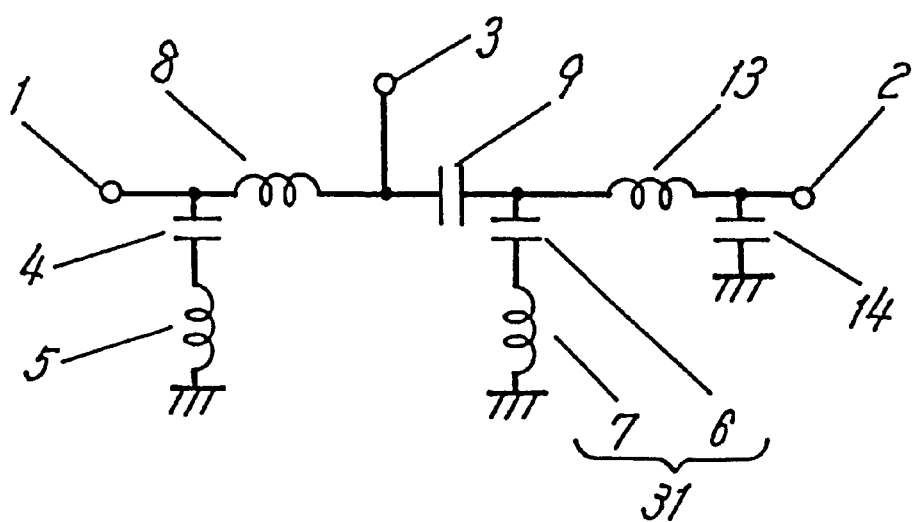
FIG. 6 is a circuit diagram of a multiplexer/demultiplexer in a fourth exemplary embodiment of the present invention.

FIG. 6 is a circuit diagram of a multiplexer/demultiplexer in the fourth exemplary embodiment of the present invention. The circuit of this embodiment is one in which an inductive element 13 and a capacitive element 14 have been respectively connected in series and in parallel between serial resonant circuit 31 and second port 2 of the first exemplary embodiment.

With this configuration, it is easy to match the impedance at each port even when the frequency at one port is as high as twice that at the other port, for example the pass band of first port 1 to third port 3 is 900 MHz while that from second port 2 to third port 3 is 1.86 Hz. At the same time, a 2-stage low-pass characteristics can be obtained in the passage from second port 2 to third port 3, and harmonics of an amplifier and the like to be connected to second port 2 can be efficiently eliminated.

Electrical characteristics of the present embodiment are as shown in Table 1 and FIG. 9.

TABLE 1

| Element | 4 | 5 | 6 | 7 | 8 | 9 | 13 | 14 |
|---|---|---|---|---|---|---|---|---|
| Value | 3.4 pF | 2.4 nH | 29.7 pF | 1.1 nH | 8.2 nH | 4.6 pF | 0.1 nH | 9.0 pF |

Figure 7:
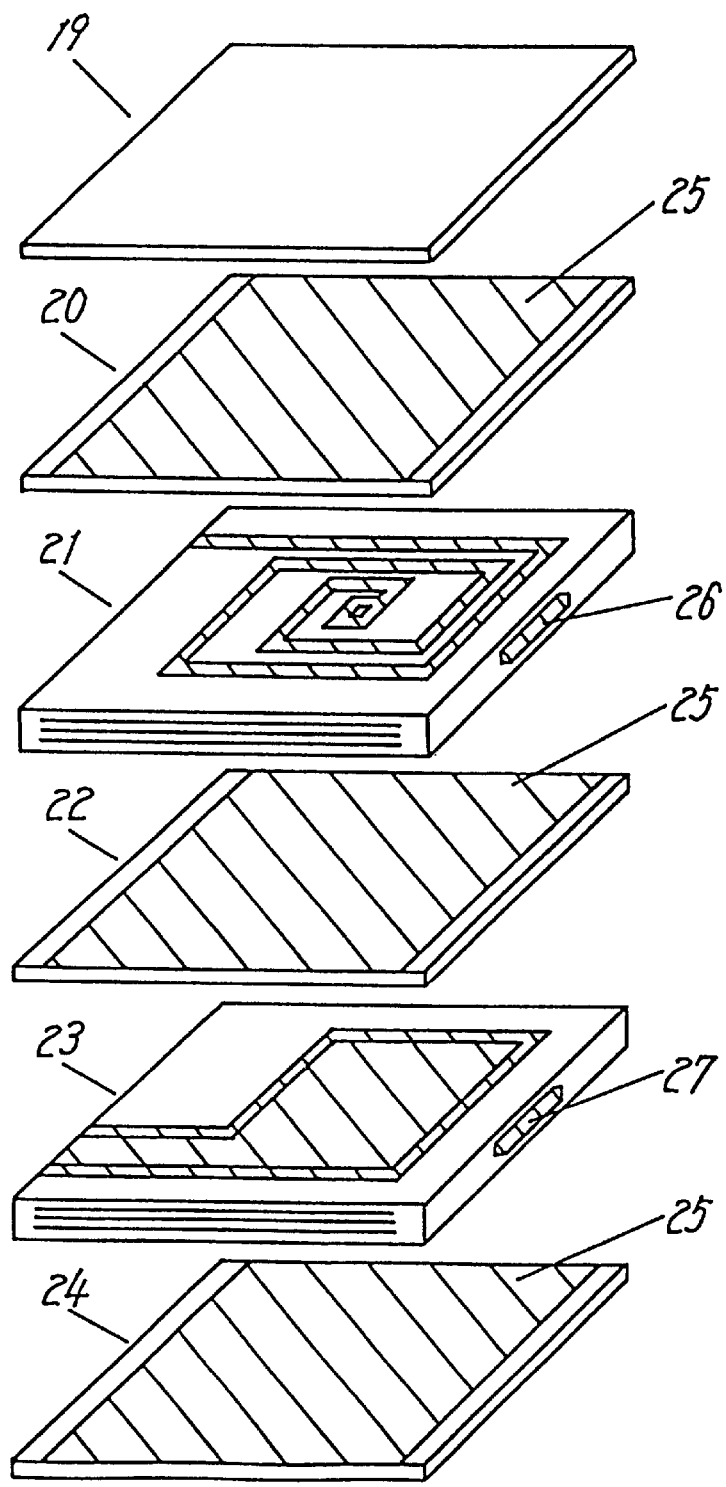
FIG. 7 is an exploded perspective view of a multiplexer/demultiplexer of the present invention.
Figure 8:
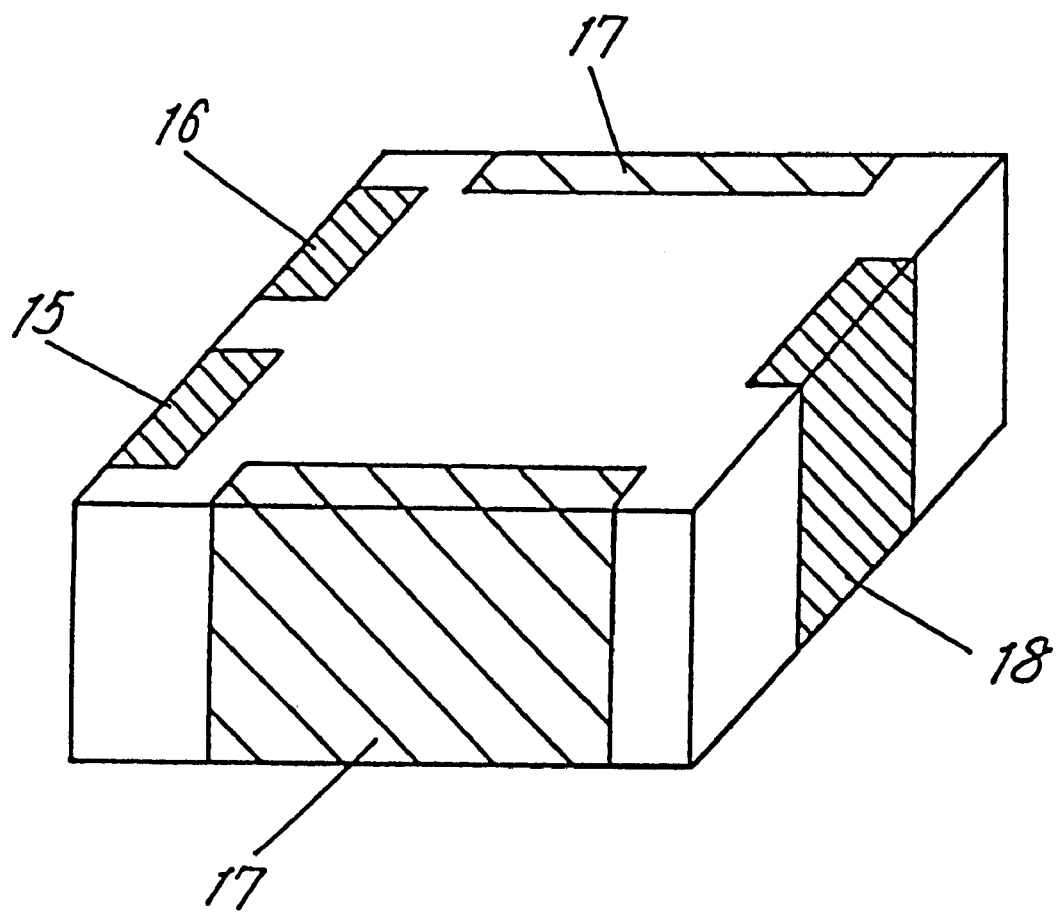
FIG. 8 is a perspective view of the multiplexer/demultiplexer.
Figure 9A:
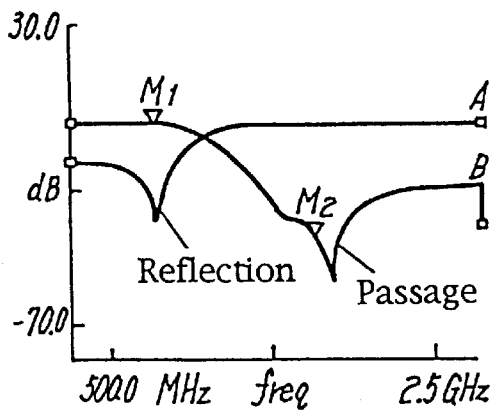
FIG. 9 is a graphical representation of the characteristics of the multiplexer/demultiplexer.
Figure 9B:
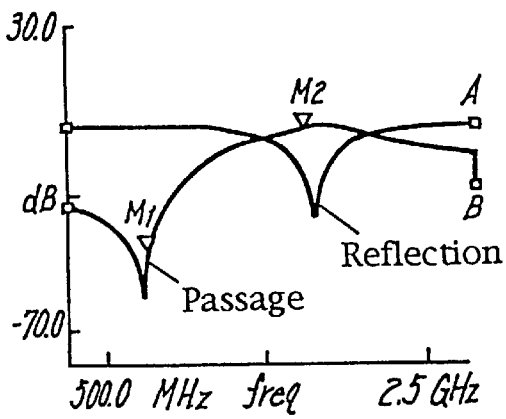
Figure 9C:
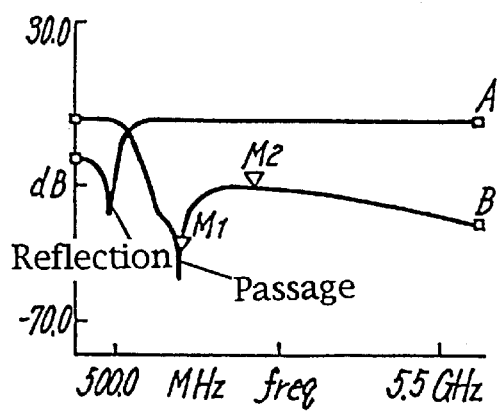
Figure 9D:
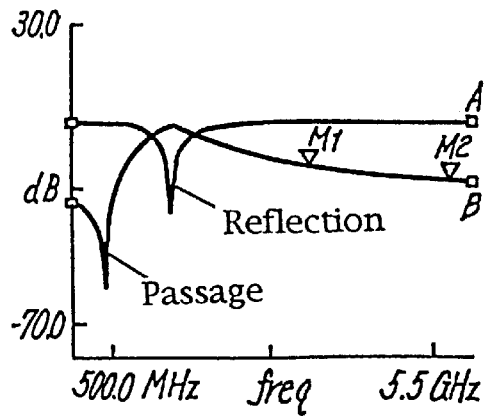

By the way, the first to fourth exemplary embodiments can be implemented by laminating dielectric sheets on which electrodes have been printed as illustrated in FIG. 7 and FIG. 8.

FIG. 7 illustrates internal construction of the present embodiment where numeral 19 is a dielectric sheet, numerals 20, 22, 24 are grounding layers printed with a grounding electrode 25, numeral 21 is a group of sheets inside which a capacitive element 4 and inductive elements 5, 8 have been printed and laminated, numeral 23 is a group of sheets inside which a capacitive element and an inductive element have been printed and laminated. In other words, these are groups of sheets on which capacitive elements 6, 9 and an inductive element 7 have been printed and laminated in the first exemplary embodiment, and capacitive elements 6, 9, 10 and inductive elements 7, 11 have been printed and laminated in the second exemplary embodiment, capacitive elements 6, 9, 12 and an inductive element 7 have been printed and laminated in the third exemplary embodiment, and capacitive elements 6, 9, 14 and inductive elements 7, 13 have been printed and laminated in the fourth exemplary embodiment, respectively.

Numeral 26 is a lead electrode of inductive element 8 on the side of port 3 while numeral 27 is a lead electrode of capacitive element 9 on the side of port 3. Lead electrodes 26, 27 are so disposed as will come one on top of the other when stacked. By employing this configuration, it is possible to maximize the amount of isolation of signals passing each filter as the portion through which two different frequency bands sharingly pass can be minimized and spurious coupling due to stray capacitance and the like can also be minimized.

By configuring grounding layers 20, 24 on both of the top and bottom ends of the multiplexer/demultiplexer as illustrated in FIG. 7, shielding effect against outside can be obtained. Furthermore, by inserting a grounding layer 22 between the circuit section connecting capacitive element 4 and inductive elements 5, 8, and the circuit section connecting capacitive elements 6, 9, 10, 12, 14 and inductive elements 7, 11, 13, the electromagnetic interaction between each filter components can be eliminated thus realizing a high level of isolation between first port 1 and second port 2. Furthermore, by laminating, an extremely small multiplexer/demultiplexer that measures, for example, 3.2 mm deep, 2.5 mm wide, and 1.3 mm high can be implemented.

FIG. 8 is a perspective view of the laminated multiplexer/demultiplexer illustrated in FIG. 7. In FIG. 8, numerals 15, 16 are input terminals, numeral 17 is a grounding terminal, and numeral 18 is an output terminal. Here, numeral 18 is a terminal electrode corresponding to third port 3. As has been described above, it forms an external terminal at the point it is taken out. External terminal 18 is also a connecting point for inductive element 8 and capacitive element 9. By employing this configuration, the configuration can be made simpler and, at the same time, it becomes possible to form the above described grounding electrode for isolation up to immediately before the connecting point.

By the way, as a ceramic material for lamination, a glass ceramic material consisting of a mixture of 55–65% by weight of a glass composition powders consisting of 40–50% by weight $SiO_2$, 30–40% by weight BaO, 3–8% by weight $Al_2O_3$, 8–12% by weight $La_2O_3$, and 3–6% by weight $B_2O_3$, and 45–35% by weight forsterite ($Mg_2SiO_4$); or a glass ceramic material consisting of a mixture of 50–65% by weight glass composition powders consisting of 40–50% by weight $SiO_2$, 30–40% by weight BaO, 3–8% by weight $Al_2O_3$, 8–12% by weight $La_2O_3$, and 3–6% by weight $B_2O_3$, 50–35% by weight forsterite ($Mg_2SiO_4$) can be used after adding 0.2–5% by weight CuO equivalent of copper oxide as a sub-component.

By using these materials, the values of elements (on the order of 2 to 10 nH for inductive elements, and 2 to 30 pF for capacitive elements) as used in the exemplary embodiment can be efficiently realized with superior high-frequency characteristics and a low loss. Regarding the mechanical characteristics too, use of these materials makes it possible to realize a multiplexer/demultiplexer that is superior in mounting reliability especially onto resin substrates because of a high anti-breakage strength and an adequately high thermal expansion coefficient, easy of manufacturing because the content of boron oxides in the glass powders is small, and the electrical characteristics at high frequencies are superior.

Fifth Exemplary Embodiment

Referring to drawings, a description of a fifth exemplary embodiment of the present invention will be given in the following.

Figure 10:
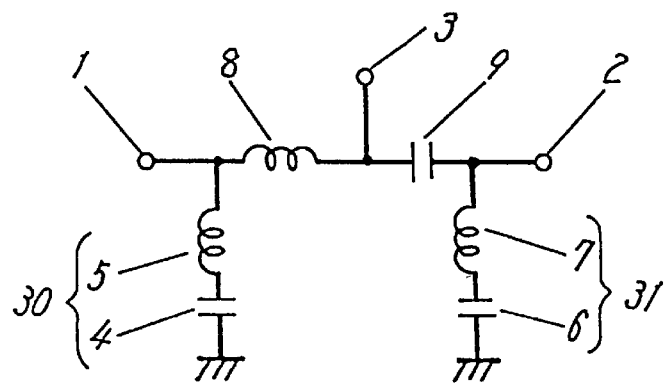
FIG. 10 is a circuit diagram of a multiplexer/demultiplexer in a fifth exemplary embodiment of the present invention.

FIG. 10 is a circuit diagram of a multiplexer/demultiplexer in the fifth exemplary embodiment of the present invention. The circuit of this embodiment is one in which connecting relationships in the first exemplary embodiment of capacitive element 4 and inductive element 5, and capacitive element 6 and inductive element 7 have been reversed, and in which more pronounced effect is obtained when applied to a high-frequency circuit in the GHz range or above.

Figure 11A:
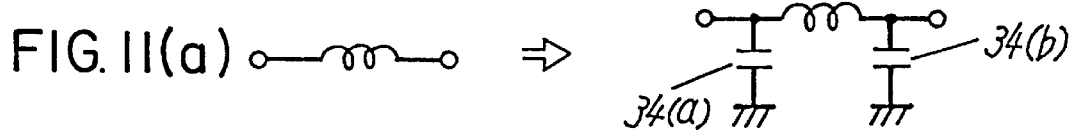
FIG. 11 is a circuit diagram illustrating parasitic capacitance of a capacitive element and inductive element in a high frequency region.
Figure 11B:
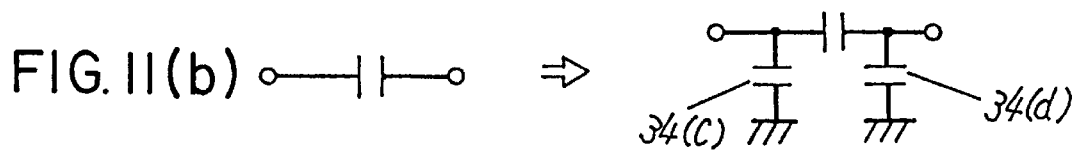
Figures 12A, 12B:
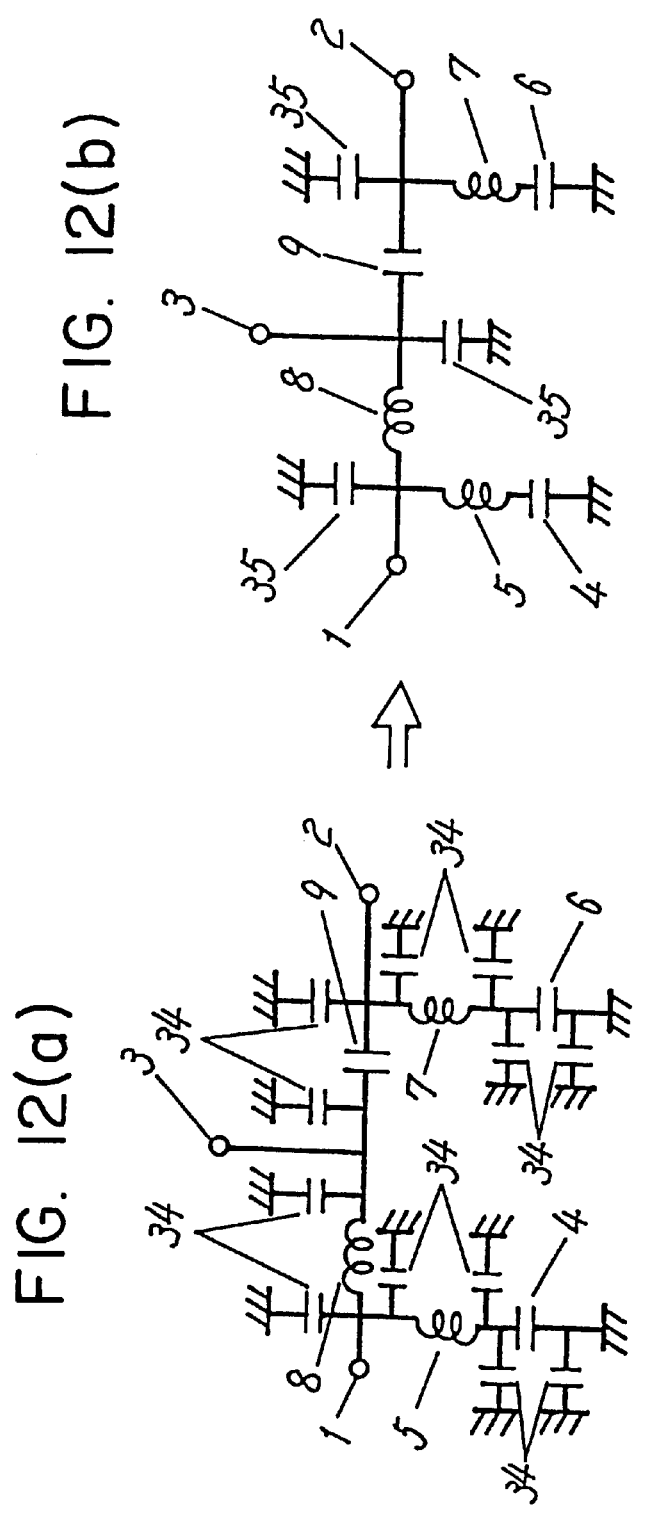

In actually fabricating a circuit, neither of the inductive elements and capacitive elements are difficult to exist as single elements from the view point of high-frequency circuits. In practice, as parasitic capacitances (stray capacitances) 34(*a*)–34(*d*) exist at both ends of each of the inductive elements and the capacitive elements as illustrated in FIGS. 11(*a*) and (*b*), they have to be taken into account when designing a circuit. In the case of each element of the present embodiment, the parasitic capacitances are as shown in FIG. 12(*a*), which can be further summarized as in FIG. 12(*b*).

Figure 13B:
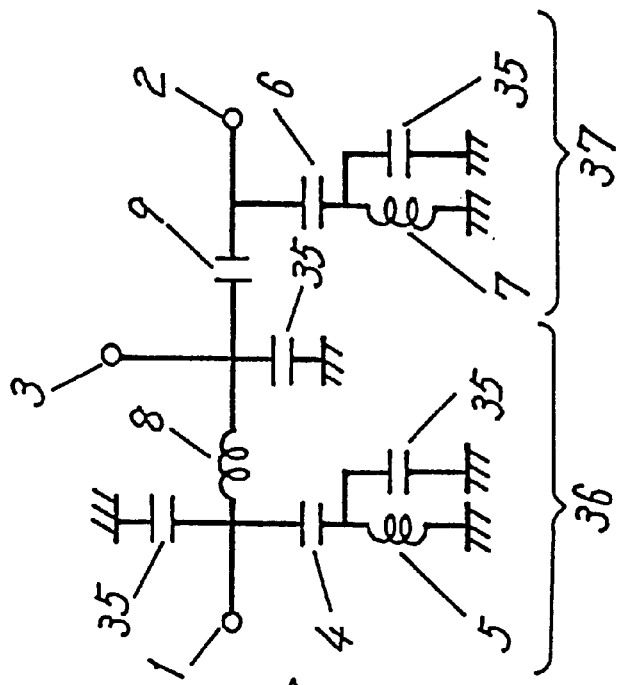
FIG. 13 is an equivalent circuit in which the parasitic capacitance in a high frequency region is taken into account in the first exemplary embodiment.
Figure 13A:
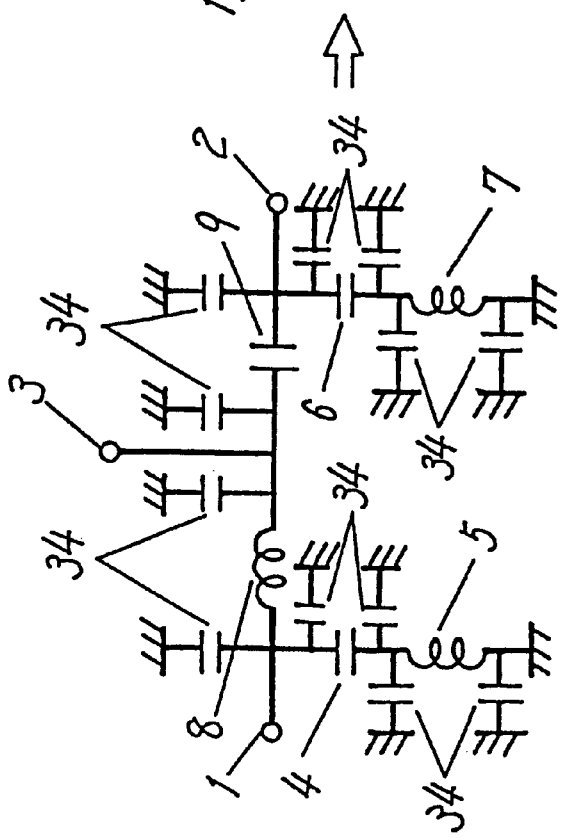
Figure 14:
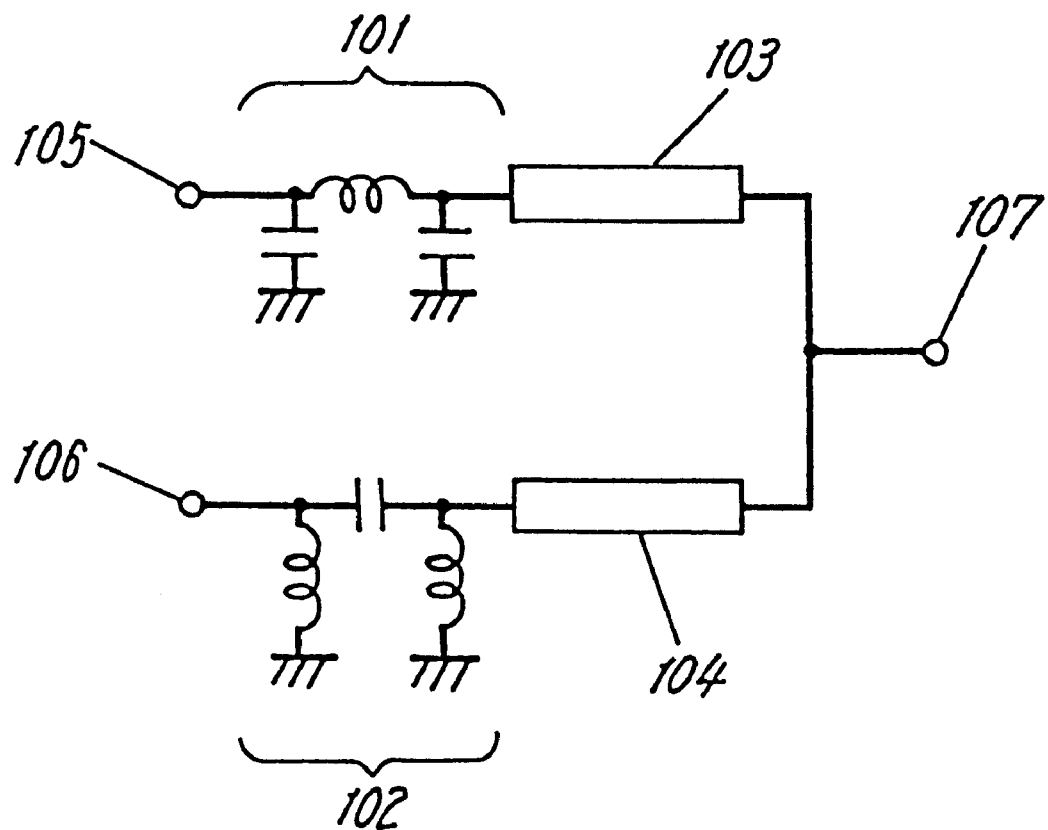
FIG. 14 is a circuit diagram of a prior art multiplexer/demultiplexer.

Similarly, when parasitic capacitances of the first exemplary embodiment are considered for the purpose of comparison, they are as shown in FIG. 13(*a*), which can be further summarized as in FIG. 13(*b*).

As shown in the drawing, in the first exemplary embodiment, unnecessary parallel resonant circuits 36, 37 are actually formed by inductive elements 5, 7 and a parasitic capacitance 35. As the parallel resonant circuits 36, 37 comprise parasitic capacitance 35, they are uncontrollable and cause a discrepancy between the designed characteristics and the characteristics that are actually realized by fabrication, presenting a serious difficulty in taking measures.

In this embodiment, because it is possible to minimize the influence of parasitic capacitances on filter characteristics by simply changing the connecting relationships of inducive elements and capacitive elements, this approach is very effective in that it enables design and embodiment of the design with ease.

INDUSTRIAL APPLICATION

As is clear from the above description, as a multiplexer/demultiplexer can be configured with an exceptionally small number of elements and with a simple circuit without using transmission lines which tend to cause a loss, the present invention provides a small and high performance multiplexer/demultiplexer with ease.

LIST OF REFERENCE NUMERALS

1. Input-output port for the low-frequency band (first port)
2. Input-output port for the high-frequency band (second port)
3. Common input-output port (third port)
4, 6, 9, 10, 12, 14, 28. Capacitive elements
5, 7, 8, 11, 13, 29. Inductive elements
15, 16, 105, 106. Input terminals
17. Grounding terminal
18, 107. Output terminal
19. Dielectric sheet
20, 22, 24. Grounding layers
21, 23. Groups of sheets
25. Grounding electrode
26, 27. Lead electrodes
30, 31, 32. Serial resonant circuit
33. Resonant circuit
34, 35. Parasitic capacitance (stray capacitance)
36, 37. Parallel resonant circuit
101. Low-pass filter
102. High-pass filter
103, 104 Phase shifters

What is claimed is:

1. A method of configuring a multiplexer/demultiplexer including first to third ports each to be externally terminated with a pure resistance, said method comprising:
   making the third port to be a common port by
      connecting a first resonant circuit between the first port and ground,
      configuring the first resonant circuit to make serial resonance at a frequency within or in proximity of a first frequency band,
      connecting an inductive element in series between the first port and the third port,
      connecting a second resonant circuit between the second port and ground, and configuring the second resonant circuit to make serial resonance at a frequency within or in proximity of a second frequency band, which is different from the first frequency band, and
      connecting a capacitive element in series between the third port and the second port;
   wherein:
      the first resonant circuit is configured by connecting a coil on the side of the first port and connecting a capacitor on the side of ground, and/or the second resonant circuit is configured by connecting a coil on the side of the second port and connecting a capacitor on the side of ground;
      configuring the first resonant circuit, second resonant circuit, inductive elements, and capacitive elements on laminated ceramic substrates; and
      a glass ceramic material consisting of a mixture of 55–65% by weight of a glass composition powder consisting of 40–50% by weight $SiO_2$, 30–40% by weight BaO, 3–8% by weight $Al_2O_3$, 8–12% by weight $La_2O_3$, and 3–6% by weight $B_2O_3$, and 45–35 by weight forsterite ($Mg_2SiO_4$) is used as the laminated ceramic material.

2. A method of configuring a multiplexer/demultiplexer including first to third ports each to be externally terminated with a pure resistance, said method comprising:
   making the third port to be a common port by
      connecting a first resonant circuit between the first port and ground,
      configuring the first resonant circuit to make serial resonance at a frequency within or in proximity of a first frequency band,
      connecting an inductive element in series between the first port and the third port,
      connecting a second resonant circuit between the second port and ground, and configuring the second resonant circuit to make serial resonance at a frequency within or in proximity of a second frequency band, which is different from the first frequency band, and connecting a capacitive element in series between the third port and the second port;

wherein:

the first resonant circuit is configured by connecting a coil on the side of the first port and connecting a capacitor on the side of ground, and/or the second resonant circuit is configured by connecting a coil on the side of the second port and connecting a capacitor on the side of ground;

configuring the first resonant circuit, second resonant circuit, inductive elements, and capacitive elements on laminated ceramic substrates; and a glass ceramic material consisting of a mixture of 50–65% by weight of a glass composition powder consisting of 40–50% by weight $SiO_2$, 30–40% by weight BaO, 3–8% by weight $Al_2O_3$, 8–12% by weight $La_2O_3$, and 3–6% by weight $B_2O_3$, and 50–35% by weight forsterite ($Mg_2SiO_4$) is used as the laminated ceramic material after adding 0.2–5% by weight CuO equivalent of copper oxide as a sub-component.

3. A multiplexer/demultiplexer comprising:

a first port to be terminated with a pure resistance;

a second port to be terminated with a pure resistance;

a third port to be terminated with pure resistance, said third port being a common port;

a first resonant circuit connected between said first port and ground, operable to make serial resonance at a frequency within or in proximity of a first frequency band, said first resonant circuit including a coil connected to said first port and a capacitor connected to ground;

an inductive element connected in series between said first port and said third port;

a second resonant circuit connected between said second port and ground, and operable to make serial resonance at a frequency within or in proximity of a second frequency band, which is different from the first frequency band; and a capacitive element connected in series between said third port and said second port;

wherein the first resonant circuit, second resonant circuit, inductive elements, and capacitive elements are configured on laminated ceramic substrates of a glass ceramic material consisting of a mixture of 55–65% by weight of a glass composition powder consisting of 40–50% by weight $SiO_2$, 30–40% by weight BaO, 3–8% by weight $Al_2O_3$, 8–12% by weight $La_2O_3$, and 3–6% by weight $B_2O_3$, and 45–35% by weight forsterite ($Mg_2SiO_4$).

4. A multiplexer/demultiplexer according to claim 3, wherein said second resonant circuit includes a coil connected to said second port and a capacitor connected to ground.

5. A multiplexer/demultiplexer according to claim 3, wherein said second resonant circuit includes a coil connected to ground and a capacitor connected to said second port.

6. A multiplexer/demultiplexer comprising:

a first port to be terminated with a pure resistance;

a second port to be terminated with a pure resistance;

a third port to be terminated with pure resistance, said third port being a common port;

a first resonant circuit connected between said first port and ground, operable to make serial resonance at a frequency within or in proximity of a first frequency band;

an inductive element connected in series between said first port and said third port;

a second resonant circuit connected between said second port and ground, and operable to make serial resonance at a frequency within or in proximity of a second frequency band, which is different from the first frequency band, said second resonant circuit including a coil connected to said second port and a capacitor connected to ground,; and a capacitive element connected in series between said third port and said second port;

wherein the first resonant circuit, second resonant circuit, inductive elements, and capacitive elements are configured on laminated ceramic substrates of a glass ceramic material consisting of a mixture of 55–65% by weight of a glass composition powder consisting of 40–50% by weight $SiO_2$, 30–40% by weight BaO, 3–8% by weight $Al_2O_3$, 8–12% by weight $La_2O_3$, and 3–6% by weight $B_2O_3$, and 45–35% by weight forsterite ($Mg_2SiO_4$).

7. A multiplexer/demultiplexer according to claim 6, wherein said first resonant circuit includes a coil connected to said first port and a capacitor connected to ground.

8. A multiplexer/demultiplexer according to claim 6, wherein said first resonant circuit includes a coil connected to ground and a capacitor connected to said first port.

9. A multiplexer/demultiplexer comprising:

a first port to be terminated with a pure resistance;

a second port to be terminated with a pure resistance;

a third port to be terminated with pure resistance, said third port being a common port, a first resonant circuit connected between said first port and ground, operable to make serial resonance at a frequency within or in proximity of a first frequency band, said first resonant circuit including a coil connected to said first port and a capacitor connected to ground;

an inductive element connected in series between said first port and said third port;

a second resonant circuit connected between said second port and ground, and operable to make serial resonance at a frequency within or in proximity of a second frequency band, which is different from the first frequency band; and a capacitive element connected in series between said third port and said second port;

wherein the first resonant circuit, second resonant circuit, inductive elements, and capacitive elements are configured on laminated ceramic substrates of a glass ceramic material consisting of a mixture of 50–65% by weight of a glass composition powder consisting of 40–50% by weight $SiO_2$, 30–40% by weight BaO, 3–8% by weight $Al_2O_3$, 8–12% by weight $La_2O_3$, and 3–6% by weight $B_2O_3$, and 50–35% by weight forsterite ($Mg_2SiO_4$) after adding 0.2–5% by weight CuO equivalent of copper oxide as a sub-component.

10. A multiplexer/demultiplexer according to claim 9, wherein said second resonant circuit includes a coil connected to said second port and a capacitor connected to ground.

11. A multiplexer/demultiplexer according to claim 9, wherein said second resonant circuit includes a coil connected to ground and a capacitor connected to said second port.

12. A multiplexer/demultiplexer comprising:

a first port to be terminated with a pure resistance;

a second port to be terminated with a pure resistance;

a third port to be terminated with pure resistance, said third port being a common port;

a first resonant circuit connected between said first port and ground, operable to make serial resonance at a frequency within or in proximity of a first frequency band;

an inductive element connected in series between said first port and said third port;

a second resonant circuit connected between said second port and ground, and operable to make serial resonance at a frequency within or in proximity of a second frequency band, which is different from the first frequency band, said second resonant circuit including a coil connected to said second port and a capacitor connected to ground; and a capacitive element connected in series between said third port and said second port;

wherein the first resonant circuit, second resonant circuit, inductive elements, and capacitive elements are configured on laminated ceramic substrates of a glass ceramic material consisting of a mixture of 50–65% by weight of a glass composition powder consisting of 40–50% by weight $SiO_2$, 30–40% by weight BaO, 3–8% by weight $Al_2O_3$, 8–12% by weight $La_2O_3$, and 3–6% by weight $B_2O_3$, and 50–35% by weight forsterite ($Mg_2SiO_4$) after adding 0.2–5% by weight CuO equivalent of copper oxide as a sub-component.

13. A multiplexer/demultiplexer according to claim 12, wherein said first resonant circuit includes a coil connected to said first port and a capacitor connected to ground.

14. A multiplexer/demultiplexer according to claim 12, wherein said first resonant circuit includes a coil connected to ground and a capacitor connected to said first port.

* * * * *